(12) United States Patent  (10) Patent No.: US 6,636,334 B2
Nakamura  (45) Date of Patent: Oct. 21, 2003

(54) SEMICONDUCTOR DEVICE HAVING HIGH-DENSITY PACKAGING THEREOF

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/986,701

(22) Filed: Nov. 9, 2001

(65) Prior Publication Data

US 2002/0064900 A1 May 30, 2002

Related U.S. Application Data

(62) Division of application No. 09/435,486, filed on Nov. 8, 1999, now Pat. No. 6,333,566, which is a division of application No. 09/421,353, filed on Oct. 18, 1999, now Pat. No. 6,285,466.

(30) Foreign Application Priority Data

Mar. 26, 1999 (JP) .......................................... 11-084040

(51) Int. Cl.⁷ ................................................. H04N 1/00
(52) U.S. Cl. ...................... 358/434; 358/482; 358/513; 257/684
(58) Field of Search ............................... 358/434, 513, 358/514, 482, 483, 484; 257/684, 693, 698

(56) References Cited

U.S. PATENT DOCUMENTS

| 3,536,964 | A | * | 10/1970 | Lob et al. | |
|---|---|---|---|---|---|
| 4,989,063 | A | * | 1/1991 | Kolesar, Jr. | |
| 4,996,587 | A | * | 2/1991 | Hinrichsmeyer et al. | |
| 5,138,433 | A | * | 8/1992 | Hiruta | |
| 5,241,456 | A | * | 8/1993 | Marcinkiewicz et al. | ... 257/686 |
| 5,280,192 | A | * | 1/1994 | Kryzaniwsky | ............... 257/723 |
| 5,384,689 | A | * | 1/1995 | Shen | ........................... 257/686 |
| 5,422,513 | A | * | 6/1995 | Marcinkiewicz et al. | ... 257/668 |
| 5,696,666 | A | * | 12/1997 | Miles et al. | ................. 257/684 |
| 5,723,900 | A | * | 3/1998 | Kojima et al. | .............. 257/646 |
| 5,723,907 | A | * | 3/1998 | Akram | ........................ 257/723 |
| 5,739,585 | A | * | 4/1998 | Akram et al. | ................ 257/680 |
| 5,744,862 | A | * | 4/1998 | Ishii | ........................... 257/686 |
| 5,763,939 | A | * | 6/1998 | Yamashita | ................... 257/686 |
| 5,798,564 | A | * | 8/1998 | Eng et al. | .................... 257/686 |
| 5,811,879 | A | * | 9/1998 | Akram | ........................ 257/723 |
| 5,986,339 | A | * | 11/1999 | Pai et al. | ..................... 257/700 |
| 6,013,948 | A | * | 1/2000 | Akram et al. | ................ 257/686 |
| 6,122,171 | A | * | 9/2000 | Akram et al. | ................ 257/712 |
| 6,153,928 | A | * | 11/2000 | Cho | ............................ 257/686 |
| 6,163,069 | A | * | 12/2000 | Oohira et al. | ................ 257/684 |
| 6,336,269 | B1 | * | 1/2002 | Eldridge et al. | .............. 29/885 |

* cited by examiner

Primary Examiner—Mark Wallerson
(74) Attorney, Agent, or Firm—Rabin & Berdo, P.C.

(57) ABSTRACT

A semiconductor device comprises a semiconductor IC chip provided with bond pads on its first surface, a wiring board provided with a through hole extending between the opposite surfaces thereof, conductive members electrically connecting the bond pads of the semiconductor IC chip to those formed on the wiring board, and a sealing resin coating coating the surface of the semiconductor IC chip and the conductive members, and bonding the side surfaces of the semiconductor IC chip to the side surfaces of the through hole of the wiring board.

32 Claims, 7 Drawing Sheets

SEMICONDUCTOR DEVICE HAVING HIGH-DENSITY PACKAGING THEREOF

CROSS-REFERENCE TO RELATED APPLICATION

This application is a divisional of application Ser. No. 09/435,486, which was filed on Nov. 8, 1999 now U.S. Pat No. 6,333,566 which is a division of Ser. No. 09/421,353 Oct. 18, 1999 U.S. No. 6,285,466.

BACKGROUND OF THE INVENTION

1. Field of the Invention

The present invention relates to a semiconductor device and a method of fabricating the same. More particularly, the present invention relates to a thin semiconductor device that permits high-density packaging, and a method of fabricating the semiconductor device.

2. Description of the Related Art

A conventional semiconductor device is constructed by fixing a semiconductor IC chip to a wiring board with an adhesive, electrically connecting bond pads of the semiconductor IC chip to bond pads formed on the wiring board with metal wires, and sealing the semiconductor IC chip and the metal wires in a resin for protection.

When fabricating this conventional semiconductor device, the semiconductor IC chip is fixed to the wiring board with the adhesive, the bond pads of the semiconductor IC chip are electrically connected to the bond pads of the wiring substrate using metal wires, and the semiconductor IC chip and the metal wires are covered with and sealed in the resin.

The conventional technique, however, has the following problems. The respective thicknesses of the semiconductor IC chip and the layer of the adhesive bonding the semiconductor IC chip to the wiring substrate are included in the thickness of the semiconductor device, which makes it difficult to form the semiconductor device in a small thickness.

The area of the layer of the adhesive is greater than that of the semiconductor IC chip, and the layer of the adhesive spreads in an unpredictable shape when compressed between the semiconductor IC chip and the wiring board. Therefore, the bond pads of the wiring board to which the bond pads of the semiconductor IC chip are to be connected by the metal wires must be spaced from the periphery of the semiconductor IC chip by, for example, 8 mm or above, which makes high-density packaging difficult.

SUMMARY OF THE INVENTION

Accordingly, it is an object of the present invention to provide a thin semiconductor device that enables permitting high-density packaging thereof.

With the foregoing object, the present invention provides a semiconductor device comprising a semiconductor IC chip provided on its first surface with bond pads; a wiring substrate provided with a through hole extending between its first surface and its second surfaces opposed to the first surface; conductive members electrically connecting the bond pads of the semiconductor IC chip to conductive lines formed on the wiring substrate; and a resin molding covering the surface of the semiconductor IC chip and fixing side surface of the semiconductor IC chip to side surface of the through hole.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

First Embodiment

Figure 1:
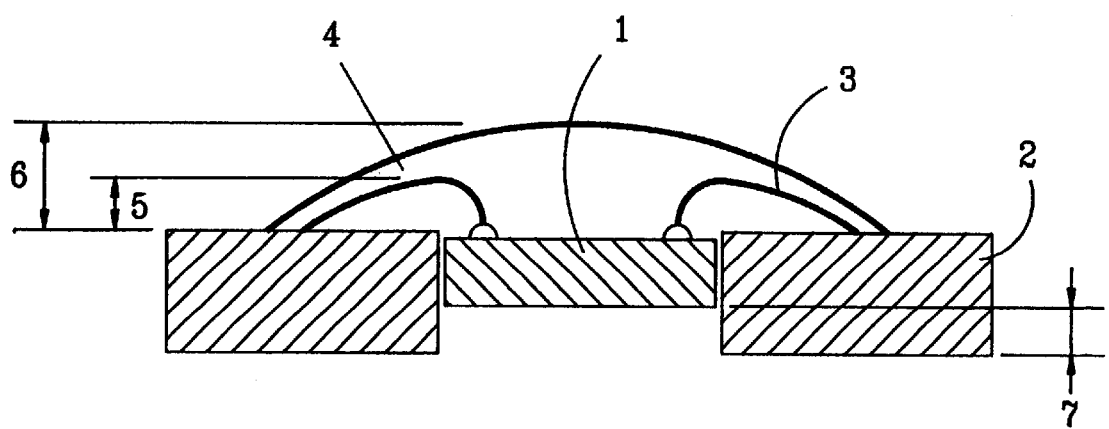
FIG. 1 is a sectional view of a semiconductor device in a first embodiment according to the present invention.
Figure 2A:
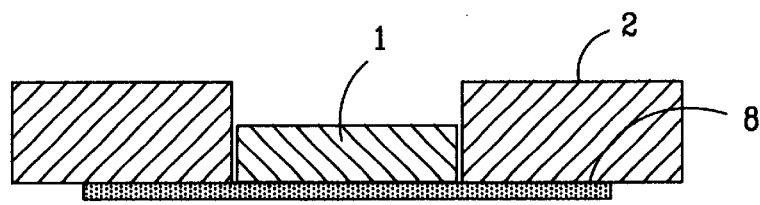
FIGS. 2(a) to 2(e) are typical sectional views of assistance in explaining a method of fabricating the semiconductor device in the first embodiment.
Figure 2B:
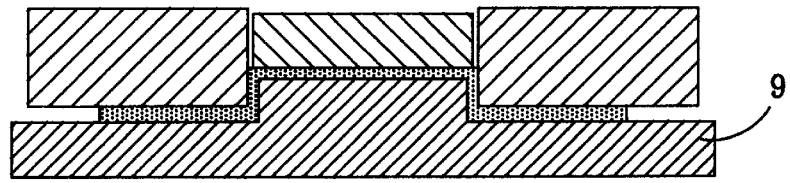
Figure 2C:
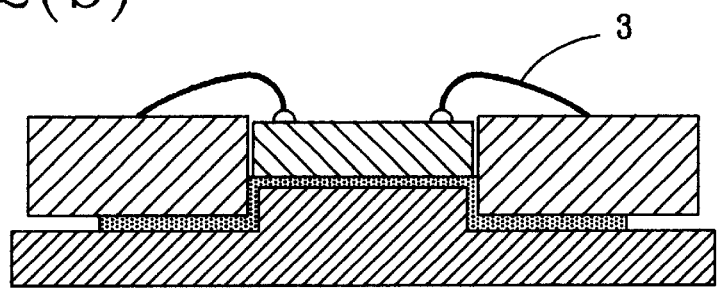
Figure 2D:
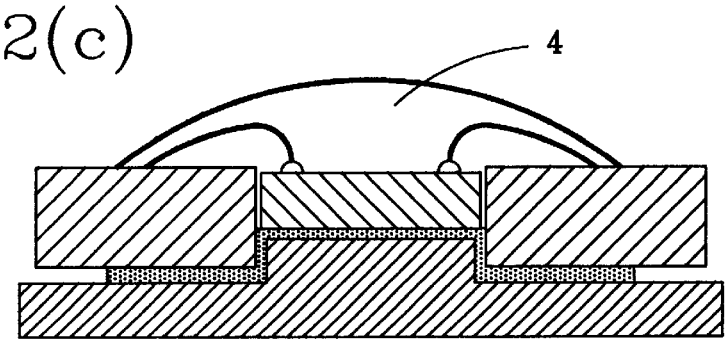
Figure 2E:
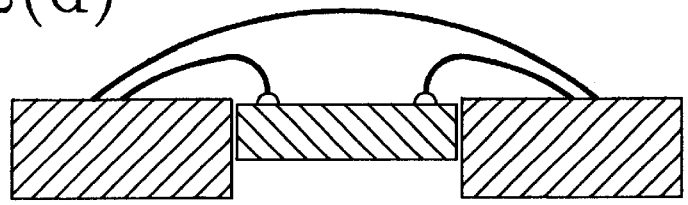
Figure 3A:
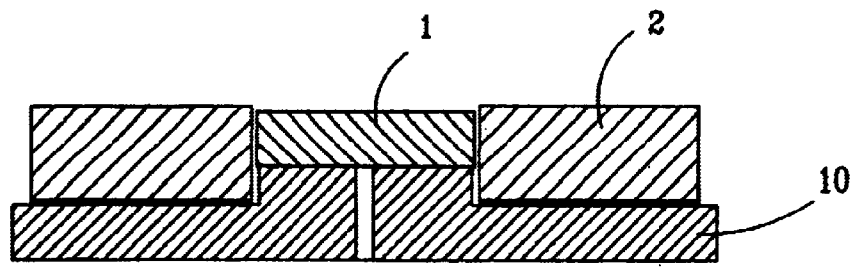
FIGS. 3(a) to 3(d) are typical sectional views of assistance in explaining another method of fabricating the semiconductor device in the first embodiment.
Figure 3B:
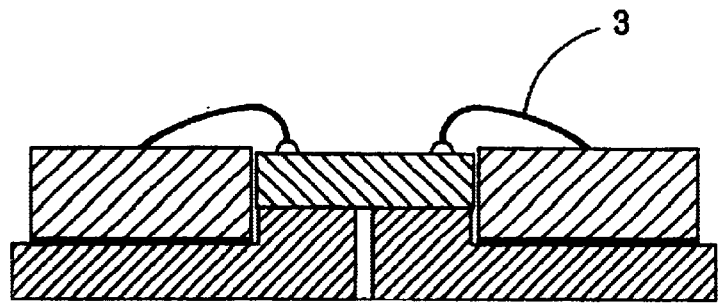
Figure 3C:
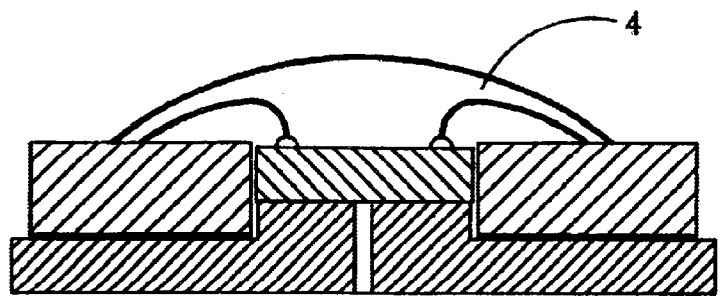
Figure 3D:
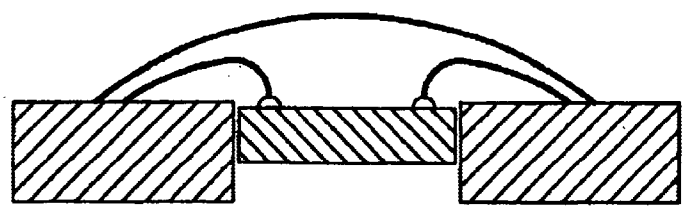

Referring to FIG. 1, a semiconductor device in a first embodiment according to the present invention comprises a semiconductor IC chip 1 provided on its front surface with bond pads, a wiring substrate 2 provided with a through hole, metal wires 3, and a sealing resin coating 4. The metal wires 3 are extended to a height 5 that is described below. The sealing resin coating 4 has a height 6 that is described below. The back surface of the semiconductor IC chip 1 is spaced a distance 7 apart from the back surface of the wiring substrate 2.

Referring to FIG. 1, the semiconductor IC chip 1 is inserted in the through hole of the wiring board 2, and the bond pads of the semiconductor IC chip 1 are electrically connected to the bond pads formed at the edge of the conductive lines of the wiring substrate 2 using the metal wires 3. The sealing resin coating molding 4 coats the semiconductor IC chip 1 and the metal wires 3. Part of the sealing resin coating 4 fills up gaps between the side surfaces of the semiconductor IC chip 1 and the side surface of the through hole of the wiring substrate 2 to bond the semiconductor IC chip 1 to the wiring substrate 2.

The height 5 of the metal wires 3 is in the maximum range of 150 to 250 $\mu$m, and hence the thickness 6 of the sealing resin coating 4 is in the range of 170 to 270 $\mu$m. The thickness 6 is 270 $\mu$m. The sealing resin coating 4 may possibly flow through the gaps between the side surfaces of the semiconductor IC chip 1 and the side surfaces of the through hole of the wiring substrate 2 onto the back surface of the semiconductor IC chip 1. Therefore, the back surface of the semiconductor IC chip 1 is separated from the back surface of the wiring substrate 2 by a distance 7 of 50 $\mu$m or more. If the sealing resin coating 4 that flowed onto the back surface of the semiconductor IC chip 1 is removed later, the back surface of the semiconductor IC chip 1 may be flush with the second surface of the wiring substrate 2, i.e., the distance 7 may be naught.

Since the semiconductor IC chip 1 is inserted in the through hole of the wiring substrate 2, the thickness 6 of the sealing resin coating 4 is dependent substantially only on the height 5 of the metal wires 3 and is less than that of the sealing resin coating of the corresponding conventional semiconductor device.

Thus, the semiconductor device of the present invention can be formed having a small thickness.

Since the semiconductor IC chip 1 is inserted in the through hole of the wiring substrate 2, the length of the metal wires 3 is shorter than that of corresponding conventional semiconductor and hence the total resistance of the metal wires 3 can be decreased.

Since the semiconductor IC chip 1 is inserted in the through hole of the wiring substrate 2, the semiconductor IC chip 1 can be attached to the wiring substrate 2 with its front surface substantially flush with the front surface of the wiring substrate 2 and hence the faulty coating of the semiconductor IC chip 1 and the metal wires 3 with the sealing resin coating attributable to steps between the semiconductor IC chip 1 and the wiring board 2 will rarely occur. Since no adhesive is used for attaching the semiconductor IC chip 1 to the wiring board 2, the bond pads of the wiring board need not be separated far from the edges of the semiconductor IC chip 1 to avoid being covered with an irregularly spread layer of an adhesive. The distance between the edges of the semiconductor IC chip 1 and the bond pads of the wiring board 2 may be about 0.3 mm. Accordingly, the sealing resin coating 4 can be formed in a small area, which enables high-density packaging.

Since the semiconductor IC chip 1 is attached to the wiring substrate 2 without using any adhesive, there is no occurrence of separation of the sealing resin coating 4 and the wiring substrate 2 from each other by the shrinkage of an adhesive, when used, bonding the semiconductor IC chip 1 to the wiring board 2 caused by a heat shock exerted on the adhesive or the disconnection of the metal wires 3 from the bond pads of the wiring substrate 2.

A tape provided with conductive wires, wires of a conductive paste may be used instead of the metal wires 3 to connect the bond pads of the semiconductor IC chip 1 to the bond pads of the wiring substrate 2. Generally, such a tape has a thickness in the range of 60 to 200 μm and hence the thickness 6 of the sealing resin coating 4 may be in the range of about 80 to 200 μm, which enables the fabrication of a semiconductor device having a further reduced thickness. Wires of a conductive paste are formed in a thickness in the range of 60 to 200 μm and hence the thickness 6 of the sealing resin coating 4 may be in the range of abut 50 to 220 μm, which also enables the fabrication of a semiconductor device having a further reduced thickness. Wires of a conductive paste do not come off the wiring substrate 2 easily because of their large area in contact with the wiring substrate 2.

A method of fabricating the semiconductor device in the first embodiment will be described hereinafter with reference to FIGS. 2(*a*) to 2(*e*), in which 8 is an adhesive tape and 9 is a stage provided with a projection, and parts like or corresponding to those shown in FIG. 1 are designated by the same reference characters.

As shown in FIG. 2(*a*), adhesive tape 8 provided with an adhesive layer is attached to the second surface of the wiring board 2, and the semiconductor IC chip 1 is inserted in the through hole of the wiring board 2 so as to be attached to the adhesive tape 8.

As shown in FIG. 2(*b*), the wiring substrate 2 is placed on stage 9 provided with a projection so that the projection of the stage 9 is fitted in the through hole of the wiring substrate 2 to push up the semiconductor IC chip 1 relative to the wiring board 2. Since the semiconductor IC chip 1 and the stage 9 have dimensional errors, the front surface of the semiconductor IC chip 1 extends at a height from the front surface of the wiring substrate 2 in the range of 150 μm.

As shown in FIG. 2(*c*), the bond pads of the semiconductor IC chip 1 are connected to the bond pads formed at the edge of the wiring substrate 2 by the metal wires 3, respectively.

As shown in FIG. 2(*d*), the semiconductor IC chip 1 and the metal wires 3 are coated with the sealing resin coating 4. Part of the sealing resin coating 4 fills up gaps between the side surface of the semiconductor IC chip 1 and the side surface of the through hole of the wiring substrate 2.

Finally, as shown in FIG. 2(*e*), the semiconductor device formed by thus assembling the semiconductor IC chip 1, the wiring board 2, the metal wires 3 and the sealing resin coating 4 is separated from the adhesive tape 8 and the stage 9.

Another method of fabricating the semiconductor device in the first embodiment is illustrated by FIGS. 3(*a*) to 3(*d*), in which 10 indicates a stage having a projection provided with an air passage.

As shown in FIG. 3(*a*), the projection of the stage 10 is inserted in the through hole of the wiring substrate 2, and the semiconductor IC chip 1 is inserted in the through hole of the wiring board 2 and is seated on the projection of the stage 10. Since the semiconductor IC chip I and the stage 10 have dimensional errors, the front surface of the semiconductor IC chip 1 extends at a height from the front surface of the wiring board 2 in the range of 150 μm.

As shown in FIG. 3(*b*), the bond pads of the semiconductor IC chip 1 are connected to the bond pads of the wiring substrate 2 by the metal wires 3, respectively, by a wire bonding process. During the wire bonding process, suction is exerted on the semiconductor IC chip 1 through the air passage to hold the semiconductor IC chip 1 fixedly in place on the stage 10.

As shown in FIG. 3(*c*), the semiconductor IC chip 1 and the metal wires 3 are coated with the sealing resin coating 4. Part of the sealing resin coating 4 fills up gaps between the side surface of the semiconductor IC chip 1 and the side surface of the through hole of the wiring substrate 2.

Finally, as shown in FIG. 3(*d*), the semiconductor device formed by thus assembling the semiconductor IC chip 1, the wiring substrate 2, the metal wires 3 and the sealing resin coating 4 is separated from the stage 10.

The foregoing methods of fabricating the semiconductor device in the first embodiment connect the bond pads of the semiconductor IC chip 1 to those of the wiring substrate 2 by the metal wires 3. Those methods may use tape provided with conductive wires or wires of a conductive paste instead of the metal wires 3.

Figure 4:
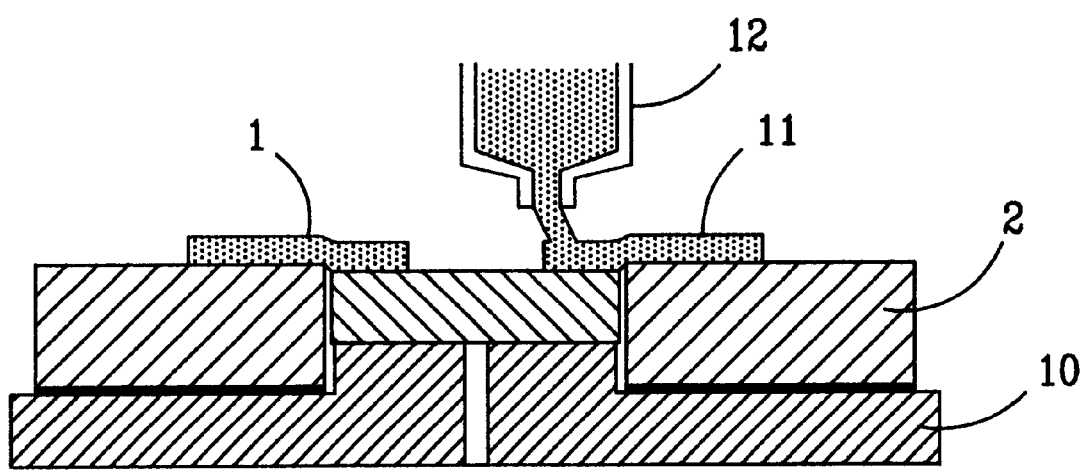
FIG. 4 is a typical sectional view of assistance in explaining a method of forming wiring lines by using a conductive paste.

A method of forming wiring lines of a conductive paste will be described hereinafter with reference to FIG. 4, in which 11 indicates a wire of a conductive paste and 12 indicates a nozzle, and parts like or corresponding to those shown in FIGS. 3(*a*) to 3(*d*) are designated by the same reference characters. As shown in FIG. 4, the conductive paste is applied to the first surfaces of the semiconductor IC chip 1 and the wiring board 2 by the nozzle 12 so as to form wiring lines 11 interconnecting the bond pads of the semiconductor IC chip 1 and the wiring board 2.

FIGS. 5(*a*) to 5(*c*) illustrate another method of forming wires of a conductive paste, in which 13 indicates a mask having a pattern of open areas corresponding to a pattern of wires and indicates 14 a squeegee, and parts like or corresponding to those shown in FIG. 4 are designated by the same reference characters.

Figure 5A:
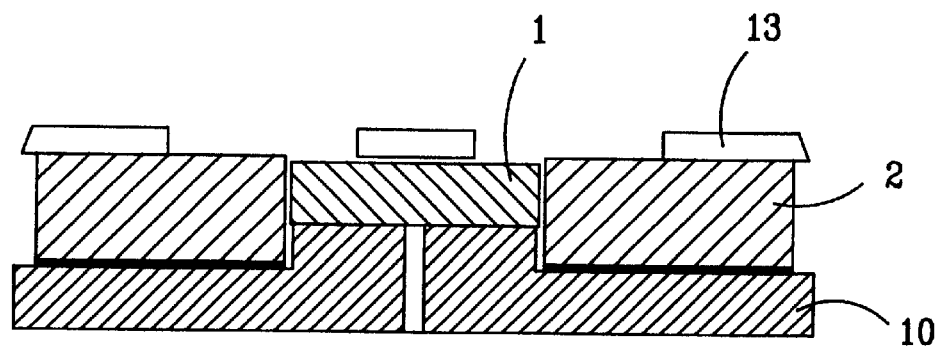
FIGS. 5(a) to 5(c) are typical sectional views of assistance in explaining a method of forming wiring lines by using a conductive paste.

As shown in FIG. 5(a), the mask 13 is disposed on the wiring board 2 so that the open areas of the mask 13 correspond to regions in which wiring lines are formed on the semiconductor IC chip 1 and the wiring board 2, respectively.

Figure 5B:
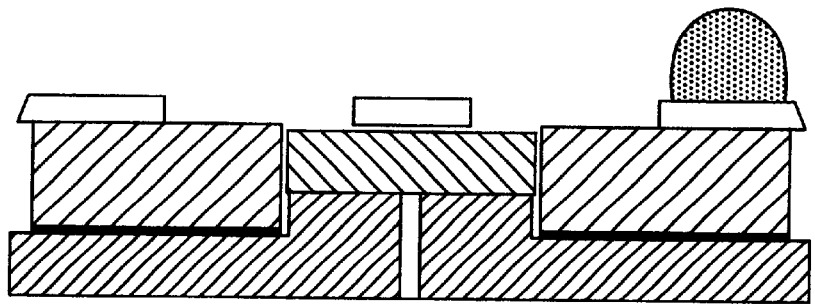

Subsequently, as shown in FIG. 5(b), a mass of a conductive paste is put on the mask 13.

Figure 5C:
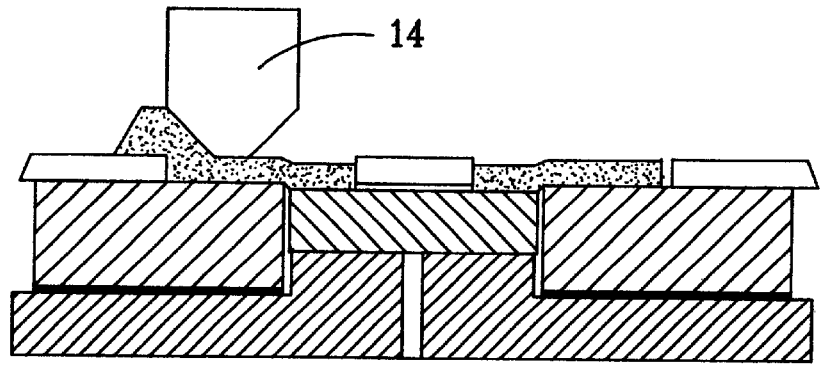

Finally, as shown in FIG. 5(c), the squeegee 14 is moved along the surface of the mask 13 in the direction of the arrow to spread the conductive paste into the open areas of the mask 13 to form the wiring lines 11. The wiring lines 11 can be formed in a substantially uniform thickness depending on the thickness of the mask 13. The wiring lines 11 can be formed in a desired thickness by selectively determining the thickness of the mask 13.

FIGS. 6(a) to 6(d) illustrate a third method of forming the wires 11 of a conductive paste, in which 15 indicates a transfer roller and 16 indicates a letterpress printing plate, and parts like or corresponding to those shown in FIG. 4 are designated by the same reference characters.

Figure 6A:
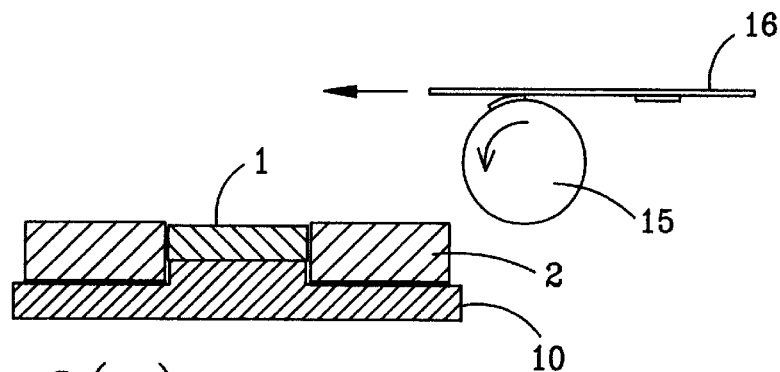
FIGS. 6(a) to 6(d) are typical sectional views of assistance in explaining a method of forming wiring lines by using a conductive paste.

As shown in FIG. 6(a), the transfer roller 15 is rotated in the direction of the arrow, and the letter press printing plate 16 having surface areas coated with a pattern of a conductive paste corresponding to a pattern of wires 11 is moved in the direction of the arrow at a speed equal to the circumferential speed of the transfer roller 15 to transfer a pattern of the conductive paste corresponding to the pattern of wires 11 to be formed on the semiconductor IC chip 1 and the wiring substrate 2 from the letterpress printing plate 16 to the transfer roller 15.

Figure 6B:
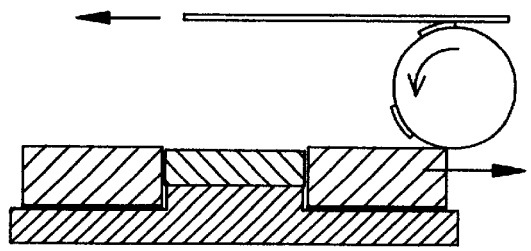

As shown in FIG. 6(b), a stage 10 supporting the wiring substrate 2 and the semiconductor IC chip 1 inserted in the through hole of the wiring substrate 2 presses the wiring substrate 2 against the circumference of the transfer roller 15 and is moved in the direction of the arrow opposite the moving direction of the letterpress printing plate 16 at a speed equal to the circumferential speed of the transfer roller 15.

Figure 6C:
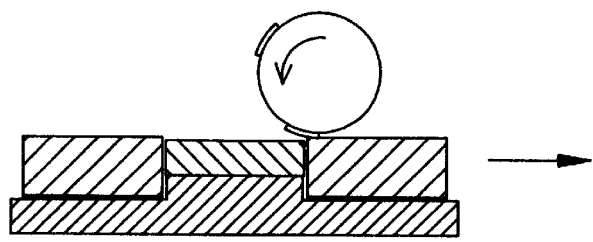
Figure 6D:
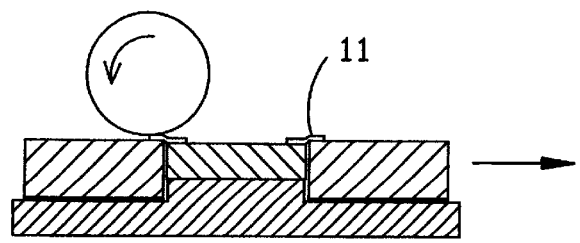

Consequently, the pattern of the conductive paste is transferred from the transfer roller 15 to the semiconductor IC chip 1 and the wiring substrate 2 as shown in FIG. 6(c) and the wires 11 of the conductive paste are formed on the front surfaces of the semiconductor IC chip 1 and the wiring substrate 2 as shown in FIG. 6(d).

Second Embodiment

Figure 7:
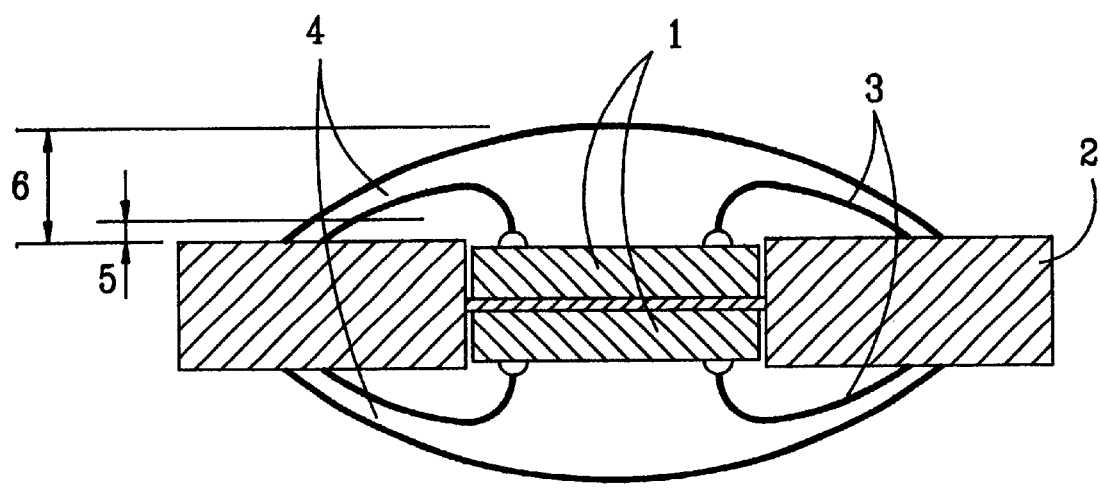
FIG. 7 is a typical sectional view of a semiconductor device in a second embodiment according to the present invention.

A semiconductor device in a second embodiment according to the present invention is shown in FIG. 7, in which parts like or corresponding to those of the first embodiment are designated by the same reference characters.

The semiconductor device in the second embodiment has a wiring substrate 2 provided with a through hole extending between the opposite surfaces thereof, and two semiconductor IC chips 1 each provided with bond pads on one surface thereof and inserted in the through hole of the wiring substrate 2 in a back-to-back arrangement with the surfaces not provided with the bond pads facing each other. The bond pads of the semiconductor IC chips 1 are electrically connected to the bond pads formed at the edge of the conductive lines of the wiring substrate 2 using metal wires 3. Sealing resin coatings 4 seal the semiconductor IC chips 1 and the metal wires 3 therein and bond together the semiconductor IC chips 1 and the wiring board 2. The sealing resin coatings 4 fill up gaps between the side surface of the semiconductor IC chips 1 and the side surfaces of the through hole of the wiring substrate 2.

The metal wires 3 extend to a height in the range of 150 to 250 $\mu$m, and each of the sealing resin coatings 4 has a height 6 in the range of about 170 to 270 $\mu$m. The maximum thickness 6 is 270 $\mu$m.

The bond pads of the semiconductor IC chips 1, similar to those of the semiconductor device in the first embodiment, may be connected electrically to the bond pads of the wiring substrate 2 by a tape provided with conductive wires or by wires of a conductive paste. When wires of a conductive paste are employed, the same may be formed by the method of forming the wires of the conductive paste previously described in connection with the first embodiment.

The semiconductor device in the second embodiment, similar to that in the first embodiment, is fabricated by inserting one of the semiconductor IC chips 1 in the through hole of the wiring substrate 2, electrically connecting the bond pads of the semiconductor IC chip 1 to bond pads formed on one of the opposite surfaces of the wiring substrate 2 using the metal wires 3, coating the semiconductor IC chip 1 and the metal wires 3 with the sealing resin coating 4, inverting the wiring substrate 2 upside down, inserting the other semiconductor IC chip 1 in the through hole of the wiring substrate 2, electrically connecting the bond pads of the semiconductor IC chip 1 to bond pads formed on the other surface of the wiring substrate by the metal wires 3, and coating the semiconductor IC chip 1 and the metal wires 3 with the sealing resin coating 4.

The semiconductor device in the second embodiment, similar to that in the first embodiment, can be formed in a small thickness and permit high-density packaging. Further, since two semiconductor IC chips are inserted in the through hole of the wiring substrate, the semiconductor device in the second embodiment has multi-function.

The semiconductor device in the present invention can be formed with a small thickness because the semiconductor IC chips are inserted in the through hole of the wiring board. Since no adhesive is used for attaching the semiconductor IC chips to the wiring substrate, the bond pads of the wiring substrate need not be separated far from the edges of the semiconductor IC chips to avoid being covered with an irregularly spread layer of an adhesive. The bond pads of the wiring substrate may be formed at positions close to the edges of the semiconductor IC chips. Accordingly, the semiconductor device can be formed in a small area, which enables high-density packaging.

The foregoing embodiments of the present invention are illustrative and not restrictive. It is obvious to those skilled in the art that various changes and modifications are possible in the foregoing embodiments without departing from the scope and spirit of the invention. The scope of the invention, therefore, is to be determined solely by the following claims.

What is claimed is:

1. A method of manufacturing a semiconductor device comprising:

providing a wiring substrate having a substrate first surface and a substrate second surface opposite to the substrate first surface, the wiring substrate having a plurality of conductive lines formed on the substrate first surface and a through hole extending between the substrate first and second surfaces;

providing a semiconductor IC chip having a chip first surface, a chip second surface opposite to the chip first surface and a plurality of chip side surfaces extending between the chip first and second chip surfaces, the semiconductor IC chip including a plurality of bond pads formed on the chip first surface;

providing a stage having a chip area for mounting the semiconductor IC chip;

mounting the semiconductor IC chip on the chip area of the stage;

aligning the stage with the wiring substrate so that the semiconductor chip is located in the through hole, and a level of the first surface of the wiring surface is substantially equal to a level of the first surface of the semiconductor IC chip;

electrically connecting the bond pads with the conductive lines by a plurality of conductive members, respectively;

coating the conductive members, the chip first surface, the chip side surfaces, the through hole and a part of the substrate first surface, with a sealing resin; and detaching the stage from the semiconductor IC chip, leaving substantially only the sealing resin physically connecting the semiconductor IC chip with the wiring substrate.

2. A method of manufacturing a semiconductor device according to claim 1, wherein the connecting includes bonding a plurality of metal wires to the bond pads with the conductive lines.

3. A method of manufacturing a semiconductor device according to claim 2, wherein a height of the metal wires above the first chip surface is about 150 to 250 $\mu$m.

4. A method of manufacturing a semiconductor device according to claim 1, wherein the connecting includes applying conductive paste between the bond pads and the conductive lines, respectively.

5. A method of manufacturing a semiconductor device according to claim 1, wherein the connecting includes:

disposing a mask on the substrate first surface and the chip first surface, the mask having a plurality of openings each of which exposes one of the bond pads, the conductive lines and a route connecting them.

spreading conductive paste into the openings, and removing the mask.

6. A method of manufacturing a semiconductor device according to claim 1, wherein the chip area of the stage is smaller than the chip second surface.

7. A method of manufacturing a semiconductor device according to claim 1, wherein the chip area of the stage has a through hole.

8. A method of manufacturing a semiconductor device according to claim 1, wherein a thickness of the semiconductor IC chip measured between the chip first and second surfaces is less than a depth of the through hole measured between the substrate first and second surfaces, and wherein said step of aligning the stage with the wiring substrate includes, with the semiconductor IC chip supported at the chip second surface on the stage chip area, urging the stage into the through hole until the level of the substrate first surface is substantially equal to the level of the chip first surface.

9. A method of manufacturing a semiconductor device comprising:

providing a wiring substrate having a substrate first surface and a substrate second surface opposite to the substrate first surface, the wiring substrate having a plurality of conductive lines formed on the substrate first surface and a through hole extending between the substrate first and second surfaces;

putting an adhesive sheet on the substrate second surface so that the adhesive sheet is exposed through the through hole;

providing a semiconductor IC chip having a chip first surface, a chip second surface opposite to the chip first surface and a plurality of chip side surfaces extending between the chip first and second surfaces, the semiconductor IC chip including a plurality of bond pads formed on the chip first surface;

positioning the semiconductor IC chip on the exposed adhesive sheet in the through hole;

providing a stage having a chip area for mounting the semiconductor IC chip;

aligning the stage with the wiring substrate so that a level of the substrate first surface is substantially equal to a level of the chip first surface;

electrically connecting the bond pads with the conductive lines by a plurality of conductive members, respectively;

coating the conductive members, the chip first surface chip side surfaces, the through hole and a part of the substrate first surface, with a sealing resin; and detaching the stage from the semiconductor IC chip, leaving substantially only the sealing resin physically connecting the semiconductor IC chip with the wiring substrate.

10. A method of manufacturing a semiconductor device according to claim 9, wherein the connecting includes bonding a plurality of metal wires to the bond pads with the conductive lines.

11. A method of manufacturing a semiconductor device according to claim 10, wherein a height of the metal wires above the chip first surface is about 150 to 250 $\mu$m.

12. A method of manufacturing a semiconductor device according to claim 9, wherein the connecting includes applying conductive paste between the bond pads and the conductive lines, respectively.

13. A method of manufacturing a semiconductor device according to claim 9, wherein the connecting includes:

disposing a mask on the substrate first surface and the chip first surface, the mask having a plurality of openings each of which exposes one of the bond pads, the conductive lines and a route connecting them, spreading conductive paste into the openings, and removing the mask.

14. A method of manufacturing a semiconductor device according to 9, wherein the chip area of the stage is smaller than the chip second surface.

15. A method of manufacturing a semiconductor device according to claim 9, wherein the chip area of the stage has a through hole.

16. A method of manufacturing a semiconductor device according to claim 9, wherein a thickness of the semiconductor IC chip measured between the chip first and second surfaces is less than a depth of the through hole measured between the substrate first and second surfaces, and wherein said step of aligning the stage with the wiring substrate includes positioning the stage with the adhesive sheet between the stage and the wiring substrate and the stage chip area aligned with the though hole, and after the step of positioning the semiconductor IC chip in the through hole on the exposed adhesive sheet, urging the stage toward the through hole so that the stage chip area moves into the hole and pushes the chip to a position at which the level of the substrate first surface is substantially equal to the level of the chip first surface.

17. A method of manufacturing a semiconductor device comprising:

provide a wiring substrate having a substrate first surface and a substrate second surface opposite to the substrate first surface, the wiring substrate having a plurality of conductive lines formed on the substrate first surface and a through hole extending between the substrate first and second surfaces;

providing a semiconductor IC chip having a chip first surface, a chip second surface opposite to the chip first surface and a plurality of chip side surfaces extending between the chip first and second surfaces, the semiconductor IC chip including a plurality of bond pads on the chip first surface;

providing a stage having a chip area for mounting the semiconductor IC chip;

mounting the semiconductor IC chip on the chip area of the stage;

aligning the stage with the wiring substrate so that the semiconductor chip is located in the through hole, and a level of the substrate first surface is substantially equal to a level of the chip first surface;

locating a pattern of conductive paste on a transfer roller;

moving the transfer roller on the substrate first surface and the chip first surface with a rotation so that the bond pads and the conductive lines are connected by the pattern of conductive paste, respectively; and coating the pattern of conductive paste, the chip first surface, the chip side surfaces, the through hole and a part of the substrate first surface with a sealing resin, wherein the sealing resin is a substantially sole member physically connecting the semiconductor IC chip with the wiring substrate.

18. A method of manufacturing a semiconductor device according to claim 17, wherein the connecting includes bonding a plurality of metal wires to the bond pads with the conductive lines.

19. A method of manufacturing a semiconductor device according to claim 18, wherein a height of the metal wires above the chip is about 50 to 250 μm.

20. A method of manufacturing a semiconductor device according to claim 17, wherein the connecting includes applying conductive paste between the bond pads and the conductive lines, respectively.

21. A method of manufacturing a semiconductor device according to claim 17, wherein the connecting includes disposing a mask on the substrate first surface and the chip first surface, the mask having a plurality of openings each of which exposes one of the bond pads, the conductive lines and a route connecting them, spreading conductive paste into the openings, and removing the mask.

22. A method of manufacturing a semiconductor device according to claim 17, wherein the chip area of the stage is smaller than the chip second surface.

23. A method of manufacturing a semiconductor device according to claim 17, wherein the chip area of the stage has a through hole.

24. A method of manufacturing a semiconductor device according to claim 17, wherein said step of locating a pattern of conductive paste on a transfer roller includes locating a pattern of conductive paste on a letter press printing plate; and transferring the pattern of conductive paste from the letter press printing plate to a transfer roller.

25. A method of manufacturing a semiconductor device comprising:

providing a wiring substrate having a substrate first surface and a substrate second surface opposite to the substrate first surface, the wiring substrate having a plurality of conductive lines formed on the substrate first surface and a through hole extending between the substrate first and second surfaces;

putting an adhesive sheet on the substrate second surface so that the adhesive sheet is exposed through the through hole;

providing a semiconductor IC chip having a chip first surface, a chip second surface opposite to the chip first surface and a plurality of chip side surfaces extending between the chip first and second surfaces, the semiconductor IC chip including a plurality of bond pads formed on the chip first surface;

positioning the semiconductor IC chip on the exposed adhesive sheet in the through hole;

providing a stage having a chip area for mounting the semiconductor IC chip;

aligning the stage with the wiring substrate so that a level of the substrate first surface is substantially equal to a level of the chip first surface;

locating a pattern of conductive paste on a transfer roller;

moving the transfer roller on the substrate first surface and the chip first surface with a rotation so that the bond pads and the conductive lines are connected by the pattern of conductive paste, respectively; and coating the pattern of conductive paste, the chip first surface, the chip side surfaces, the through hole and a part of the substrate first surface with a sealing resin, wherein the sealing resin is a substantially sole member physically connecting the semiconductor IC chip with the wiring substrate.

26. A method of manufacturing a semiconductor device according to claim 25, wherein the connecting includes bonding a plurality of metal wires to the bond pads with the conductive lines.

27. A method of manufacturing a semiconductor device according to claim 26, wherein a height of the metal wires above the chip is about 150 to 250 μm.

28. A method of manufacturing a semiconductor device according to claim 25, wherein the connecting includes applying conductive paste between the bond pads and the conductive lines, respectively.

29. A method of manufacturing a semiconductor device according to claim 25, wherein the connecting includes disposing a mask on the substrate first surface and the chip first surface, the mask having a plurality of openings each of which exposes one of the bond pads, the conductive lines and a route connecting them, spreading conductive paste into the openings, and removing the mask.

30. A method of manufacturing a semiconductor device according to claim 25, wherein the chip area of the stage is smaller than the chip second surface.

31. A method of manufacturing a semiconductor device according to claim 25, wherein the chip area of the stage has a through hole.

32. A method of manufacturing a semiconductor device according to claim 25, wherein said step of locating a pattern of conductive paste on a transfer roller includes locating a pattern of conductive paste on a letter press printing plate; and transferring the pattern of conductive paste from the letter press printing plate to a transfer roller.

* * * * *

UNITED STATES PATENT AND TRADEMARK OFFICE
CERTIFICATE OF CORRECTION

PATENT NO. : 6,636,334 B2
DATED : October 21, 2003
INVENTOR(S) : Akio Nakamura

It is certified that error appears in the above-identified patent and that said Letters Patent is hereby corrected as shown below:

<u>Title page,</u>
Item [62], Related U.S. Application Data, please delete the following words: "...which is a division of application No. 09/421,353, filed on Oct. 18, 1999, now Pat. No. 6,285,466."

Signed and Sealed this

Eighth Day of June, 2004

JON W. DUDAS
*Acting Director of the United States Patent and Trademark Office*